(12) United States Patent
French et al.

(10) Patent No.: US 7,362,168 B2
(45) Date of Patent: Apr. 22, 2008

(54) AUDIO AMPLIFIER

(75) Inventors: John B. French, Caledon East (CA);
Douglas Walter Hansen, Caledon East (CA)

(73) Assignee: Audera International Sales Inc., Bridgetown (BB)

( * ) Notice: Subject to any disclaimer, the term of this patent is extended or adjusted under 35 U.S.C. 154(b) by 0 days.

(21) Appl. No.: 11/592,115

(22) Filed: Nov. 3, 2006

(65) Prior Publication Data

US 2007/0080745 A1    Apr. 12, 2007

Related U.S. Application Data

(63) Continuation of application No. PCT/CA2005/000683, filed on May 5, 2005.

(51) Int. Cl.
*H03F 3/38* (2006.01)
(52) U.S. Cl. .................................. 330/10; 330/151
(58) Field of Classification Search ................ 770/151, 770/10, 149; 375/297; 455/114.3
See application file for complete search history.

(56) References Cited

U.S. PATENT DOCUMENTS

| | | | |
|---|---|---|---|
| 3,784,923 A | | 1/1974 | Rezek |
| 5,382,915 A | | 1/1995 | Muri et al. |
| 5,442,317 A | | 8/1995 | Stengel |
| 6,011,434 A | * | 1/2000 | Sakai ........................ 330/151 |
| 6,148,220 A | | 11/2000 | Sharp et al. |
| 6,211,728 B1 | | 4/2001 | Chen et al. |
| 6,263,084 B1 | | 7/2001 | Cressman et al. |
| 6,788,140 B2 | * | 9/2004 | Cameron et al. ........... 330/149 |
| 7,034,614 B2 | * | 4/2006 | Robinson et al. ........... 330/151 |
| 7,110,739 B2 | * | 9/2006 | Braithwaite .............. 455/276.1 |

OTHER PUBLICATIONS

Risbo, Lars, Morch, Thomas, "Performance of an All-Digital Power Amplification System", Presentation at 104th Convention May 16-19, 1998, Amsterdam, Audio Engineering Society.

* cited by examiner

*Primary Examiner*—Henry Choe
(74) *Attorney, Agent, or Firm*—Bereskin & Parr

(57) ABSTRACT

In a first aspect, the invention provides an audio amplifier. A regulator reference signal corresponding to an input audio signal is generated by regulator reference generator. A power signal is generated corresponding to the regulator reference signal by a voltage regulator. A compensation block also uses the input signal, or a delayed version of the input signal to generate a modulation control signal. A modulator generates a modulated signal in response to the modulation control signal. An output stage combines the power signal and the modulation signal to provide an output audio signal corresponding to the input audio signal. The compensation block may be a forward compensation block configured to compensate for characteristics of the regulator reference generator or the voltage regulator or both, and possibly other components of the amplifier. In other embodiments, the compensation block may be part of a feedback compensation loop. In another aspect the invention provides speakers and speaker assemblies utilizing the amplifier. In another aspect, the invention provides speakers and speaker assemblies with improved physical safety isolation.

20 Claims, 14 Drawing Sheets

AUDIO AMPLIFIER

CROSS-REFERENCE TO RELATED APPLICATIONS

This application is a continuation of PCT/CA2005/000683 filed on May 5, 2005.

FIELD OF THE INVENTION

This invention relates to amplifier circuits. More particularly, the invention relates to improved audio amplifier circuits.

BACKGROUND OF THE INVENTION

All sound reproduction systems employ some means for transducing information representing desired audio content into an audible sound field. Much effort has been made to improve the efficiency and to reduce the cost of such transducers. Audio amplifiers with modulated digital switching stages are known. However, these amplifiers remain inefficient under various conditions, including when they are called on to reproduce audio signals of a small magnitude.

Accordingly, it is desirable to provide a switching amplifier that operates efficiently and has a low cost. Furthermore, it is desirable to provide speaker and speaker assemblies that utilize the improved switching amplifier to provide an improved audio transducer.

SUMMARY OF THE INVENTION

In a first aspect, the present invention provides an audio amplifier that includes an input terminal for receiving an input audio signal, an output terminal, a regulator reference generator coupled to the input terminal, wherein the regulator reference generator provides a voltage regulator reference corresponding to the input audio signal; a voltage regulator coupled to the regulator reference generator, wherein the voltage regulator provides a power signal corresponding to the voltage regulator reference; a compensation block coupled to the input terminal to provide a modulation control signal based on the input signal; a modulator coupled to the compensation block wherein the modulator provides a modulated signal in response to the modulation control signal; and an output stage coupled to the modulator and the voltage regulator, wherein the output stage provides an output audio signal at the output terminal by combining the modulated signal and the power signal.

In another, the invention provides an amplifier suitable for operation using a typical AC power source such as a municipal power source. In one embodiment, an active ground network is utilized to provide a balanced pair of power rails about a reference ground for a push-pull output stage. In another embodiment, the power rails are offset from a reference ground to reduce voltage stress on switches in a push-pull output stage.

In another aspect, the invention provides a multi-channel audio signal amplifier for amplifying two or more audio channels, wherein each channel corresponds to one input audio signal, the amplifier comprising: for each channel: (i) an input terminal for receiving an input audio signal for that channel; (ii) an output terminal; (iii) a compensation block coupled to the input terminal for the channel to provide a modulation control signal for the channel; (iv) a modulator coupled to the compensation block for the channel to provide a modulated signal for the channel in response to the modulation control signal; and (v) an output stage; a regulator reference generator coupled to the input terminal for each channel, wherein the regulator reference generator provides a voltage regulator reference corresponding to the input audio signal having the largest magnitude; and a voltage regulator coupled to the regulator reference generator, wherein the voltage regulator provides a power signal corresponding to the voltage regulator reference, wherein the output stage for each channel is coupled to the modulator for that channel and the voltage regulator, wherein the output stage for each channel provides an output audio signal for the channel at the output terminal for the channel by combining the modulated signal for the channel and the power signal.

In another aspect, the invention provides a speaker comprising: electrical elements that are electrically live when the speaker is in use, the electrical elements including a voice coil; moving elements that move in response to an audio signal received by the voice coil, wherein the moving elements include a diaphragm; and an isolation barrier mounted between the voice coil and the diaphragm.

The electrical elements may also include an amplifier integrated into the speaker. The isolation barrier inhibits physical access to the electrical elements when the speaker is mounted in a typical speaker housing. The isolation barrier includes a central barrier typically positioned under the dust cap of a speaker, or within a voice coil former. The isolation barrier also includes a lateral barrier that is mounted around the voice coil former.

In another embodiment, the isolation barrier includes a barrier flange that extends from the side of the speaker to inhibit access to the electrical elements around the side of the speaker.

In other embodiments, the isolation barrier may also include a basket barrier that is integrated with or mounted to the basket of the speaker. The basket barrier contains apertures that are sufficiently small so as to prevent a finger or other prohibited object from contacting the electrical elements.

In another embodiment, the isolation barrier includes a canister barrier that encloses all of the electrical elements of the speaker.

A speaker according to these embodiments may be integrated into a speaker assembly that includes an amplifier.

These and other aspects of the invention are further identified and elaborated on in the course of describing various detailed embodiments below.

BRIEF DESCRIPTION OF THE DRAWINGS

A preferred embodiment of the present invention will now be described in detail with reference to the drawings, in which.

In the Figures, similar components of different embodiments of the invention are generally identified with similar reference numerals.

DETAILED DESCRIPTION OF EXEMPLARY EMBODIMENTS

Figure 1:
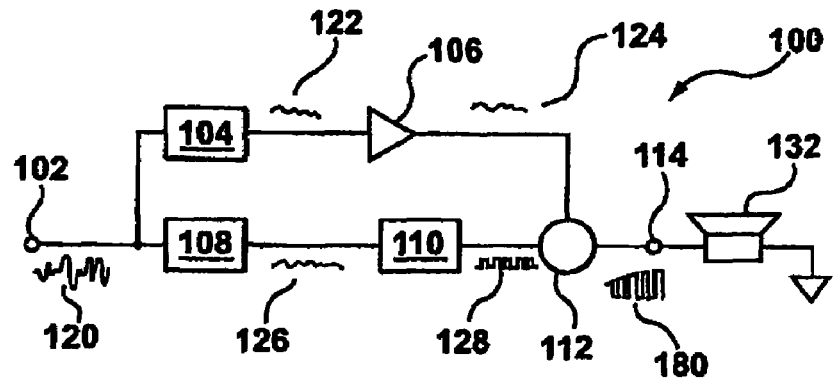
FIG. 1 illustrates a first amplifier according to the present invention.

Reference is first made to FIG. 1, which illustrates a first audio amplifier 100 according to the present invention. Amplifier 100 has an audio input terminal 102, a reference generator 104, a voltage regulator 106, a compensation block 108, a modulator 110, an output stage 112 and an audio output terminal 114.

An input audio signal 120 is received at input terminal 102. The particular characteristics of input signal 120 will depend on the system in which the amplifier is implemented. In some systems, for example, input signal 120 may be a 1 volt peak-to-peak signal with a time-varying magnitude and a time-varying frequency.

Reference generator 104 is coupled between input terminal 102 and voltage regulator 106. Reference generator 104 is configured to process input signal 120 and to provide a voltage regulator reference 122 corresponding to input 120. For example, reference generator 104 may be configured to apply a function f(n) to the input signal 120 to generate the voltage regulator reference 122. In this first exemplary embodiment, reference generator 104 applies a rectification, or absolute value, function to input signal 120. The voltage regulator reference 122 is a full-wave voltage rectified version of input signal 120.

Voltage regulator 106 receives the voltage regulator control reference 122 and provides a corresponding power signal 124. Voltage regulator 106 may be any type of voltage regulator that can receive a reference and generate one or more voltage signals in response.

In an embodiment of the invention, the voltage regulator could be any type of regulator, such as a linear or switching power supply.

Voltage regulator 106 will typically receive power from a power source (not illustrated in FIG. 1). A skilled person will be able to select and configure a suitable voltage regulator 106.

Forward compensation block 108 is coupled to input terminal 102 and provides a modulation control signal 126 corresponding to the input signal 120 and corresponding to the operation of reference generator 104. The operation of forward compensation block 108 is described in greater detail below.

Modulator 110 receives the modulation control signal 126 and provides a modulated signal 128 corresponding to the input audio signal 120. Modulator 110 may be configured to provide a pulse width modulated signal, a pulse density modulated signal or another type of modulated signal 128.

Output stage 112 receives the power signal 124 and the modulated signal 128 and combines them to provide an output audio signal 130 at output terminal 114. Modulator 110 and output stage 112 have a complementary configuration and operation.

A load such as a speaker 132 will typically be coupled to the output terminal 114, when the amplifier is in use. Optionally, a filter (not shown) may be coupled between output terminal 114 and the speaker to smooth or reconstruct the output audio signal 130 before it reaches speaker 132.

Figure 2:
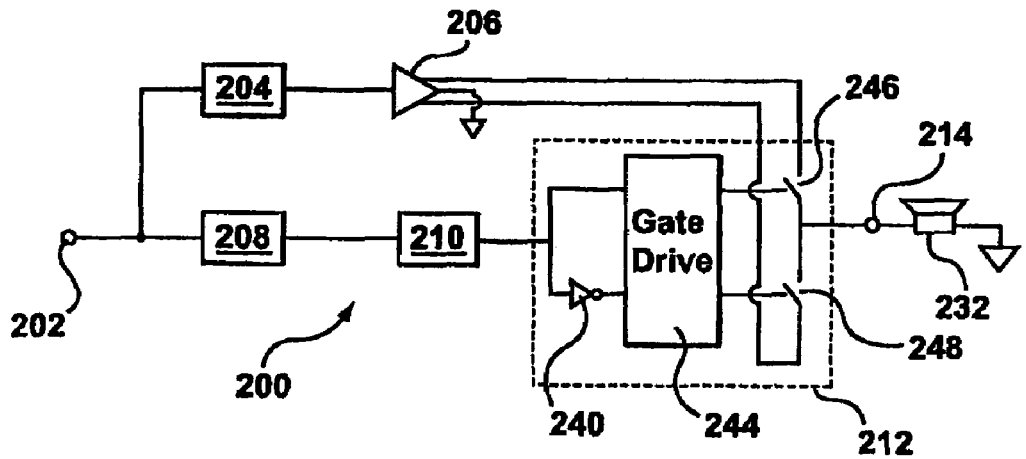
FIG. 2 illustrates a second amplifier according to the present invention.
Figure 3:
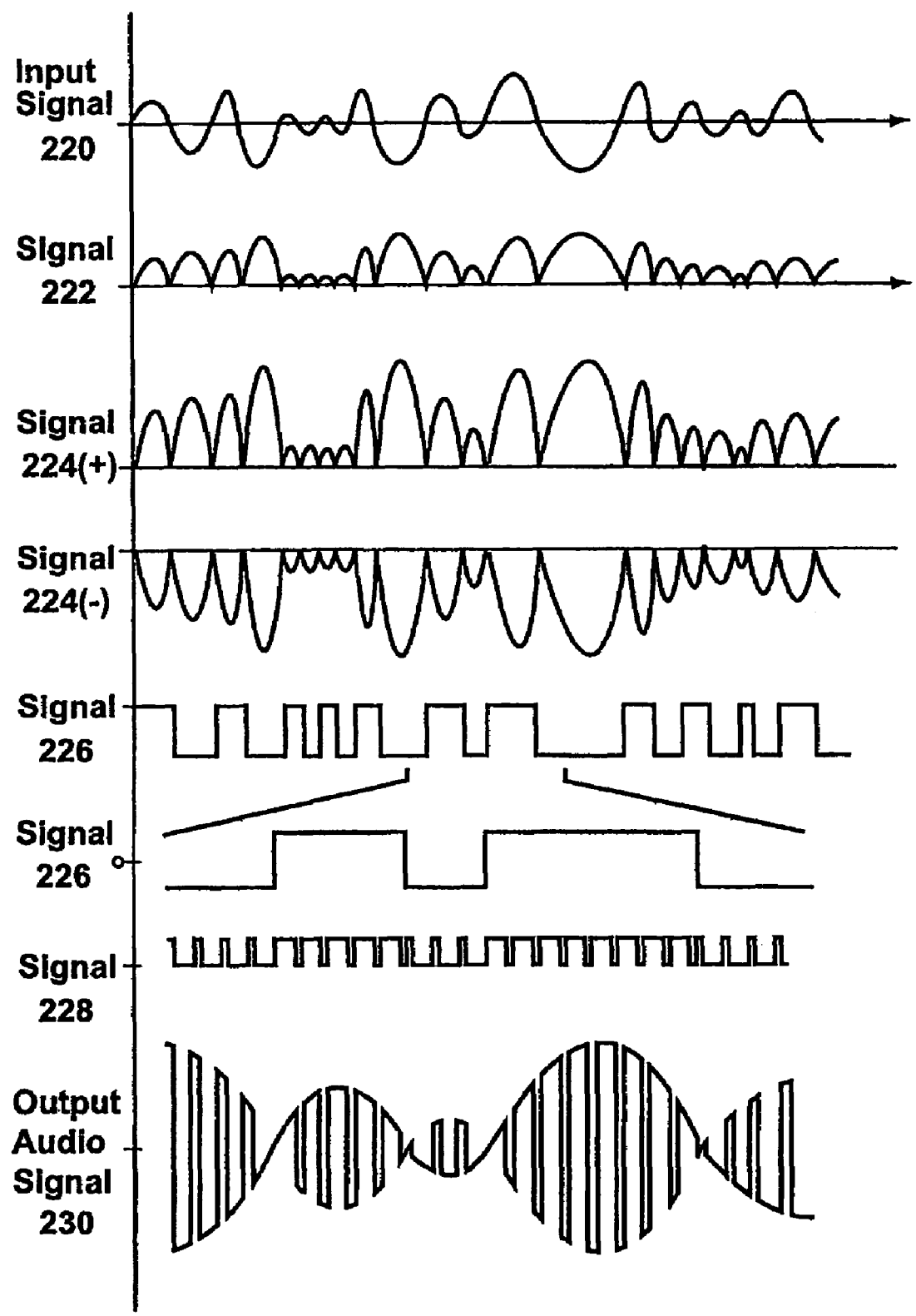
FIG. 3 illustrates several exemplary signals in the amplifier of FIG. 2.

Reference is next made to FIGS. 2 and 3. FIG. 2 illustrates a second amplifier 200 according to the present invention. FIG. 3 illustrates several exemplary signals. Amplifier 200 receives an input signal 220 at input terminal 202. Reference generator 204 provides a voltage regulator reference 222. Power regulator 206 produces a pair of symmetric voltage signals: positive voltage signal 224+ and negative voltage signal 224− in response to the voltage regulator reference 222. The positive and negative voltage signals may also be referred to as positive and negative voltage rails.

Forward compensation block 208 operates analogously to forward compensation block 108 of amplifier 100 and provide a modulation control signal 226. Modulation control signal 226 preserves the sign of input signal but is otherwise of a uniform magnitude. At the bottom of FIG. 3, a portion of signal 226 and a corresponding portion of modulated signal 228 and output signal 230 are illustrated. Modulated signal 228 is a digital signal.

Amplifier 200 has a push-pull output stage 212 that includes an inverter 240, a gate drive block 244 and a pair of switches 246 and 248. Switch 246 is coupled between the positive voltage signal 224+ and the output terminal 214. Switch 248 is coupled between the negative voltage signal 224− and the output terminal 214. Modulated signal 228 is coupled to gate drive block 244 in the original form in which it is generated by modulator 210 and in an inverted form through inverter 240. Gate drive block 244 operates switch 246 in response to the original form of modulated signal 228 so that output terminal 214 is coupled to positive voltage signal 224+ when modulated signal 228 is high. Gate drive block 244 operates switch 248 in response to the inverted form of modulated signal 228 so that output terminal 214 is coupled to negative voltage signal 224− when modulated signal 228 is low. In an alternative embodiment, only the original form of modulated signal 228 may be provided to the gate drive block and inverter 244 may be integrated into the gate drive block.

Output stage 212 generates the output audio signal 230 by coupling the positive voltage signal 224+ and the negative voltage signal 224− to the output terminal 214 in accordance with the modulated signal. Output audio signal 230 is a modulated amplified version of the input signal 220 during the corresponding time period.

A speaker 232 may be coupled directly to the output terminal 214 or alternatively, a filter (not shown) may be coupled between the output terminal and the speaker 232 to smooth output audio signal 230.

In an amplifier according to the present invention, the modulator, voltage regulator (or regulators when there is more than one, as illustrated below in relation to other embodiments) and the output stage are selected to operate together. In amplifier 200, the push-pull output stage requires a positive voltage signal and a negative voltage signal, which are generated by voltage regulator 206. Switches 246 and 248 may be transistors and gate drive block 244 is selected to provide an appropriate drive signal for the switches. In this embodiment, modulated signal 228 may be a pulse density modulated (PDM), pulse width modulated (PWM) or any other type of modulated signal.

Figure 4:
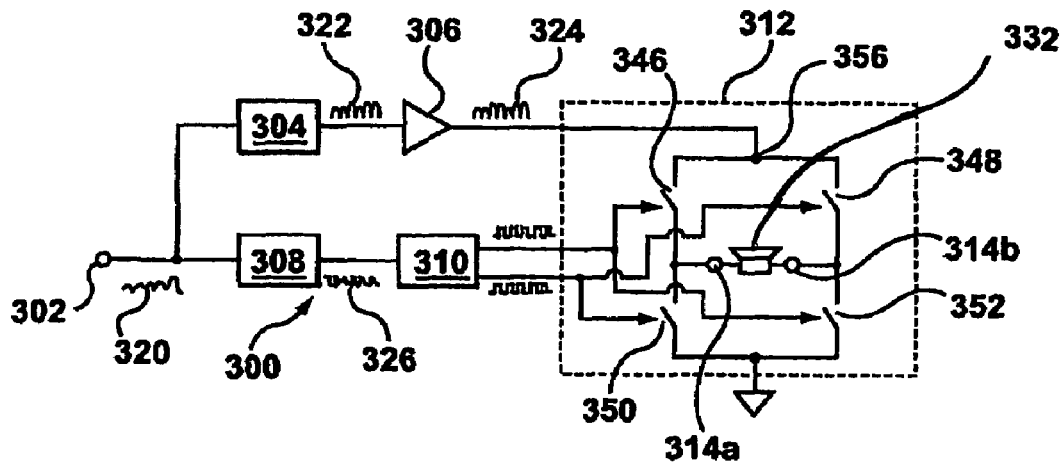
FIG. 4 illustrates a third amplifier according to the present invention.

FIG. 4 illustrates a third amplifier 300 according to the present invention. In amplifier 300, the reference generator 304 and forward compensation block 308 operate in the same manner as the corresponding components of amplifiers 100 and 200. Voltage regulator 306 provides a power signal 324 at node 356.

Amplifier 300 has a bridge output stage 312. Bridge output stage 312 includes four switches 346, 348, 350 and 352 in a bridge configuration. A load 332 is coupled between a pair of output terminals 314a and 314b. Switch 346 is coupled between node 356 and output terminal 314a. Switch 348 is coupled between node 356 and output terminal 314b. Switch 350 is coupled between output terminal 314a and ground. Switch 352 is coupled between output terminal 314b and ground.

Modulator 310 provides a pair of digital modulated signals 328+ and 328− that are used to control switches 346-352. Modulated signal 328+ controls switches 346 and 352. Modulated signal 328− control switches 350 and 354.

In this embodiment, modulated signals 328+ and 328− are symmetric in the sense that when one of them is high, the other is low. In another embodiment of an amplifier with a bridge output stage, modulated signal 328+ and 328− may provide a trinary control, which is suitable for a class BD modulation scheme.

When modulated signal 328+ is high, switches 346 and 352 are closed, switches 348 and 350 are open and current flows from node 356 through switch 346, output terminal 314a, the load 332, output terminal 314b and switch 352 to ground. When modulated signal 328− is high, switches 346 and 352 are open, switches 348 and 350 are closed and current flows from node 356 through switch 348, terminal 314b, load 332, terminal 314a and switch 350 to ground.

Figure 5:
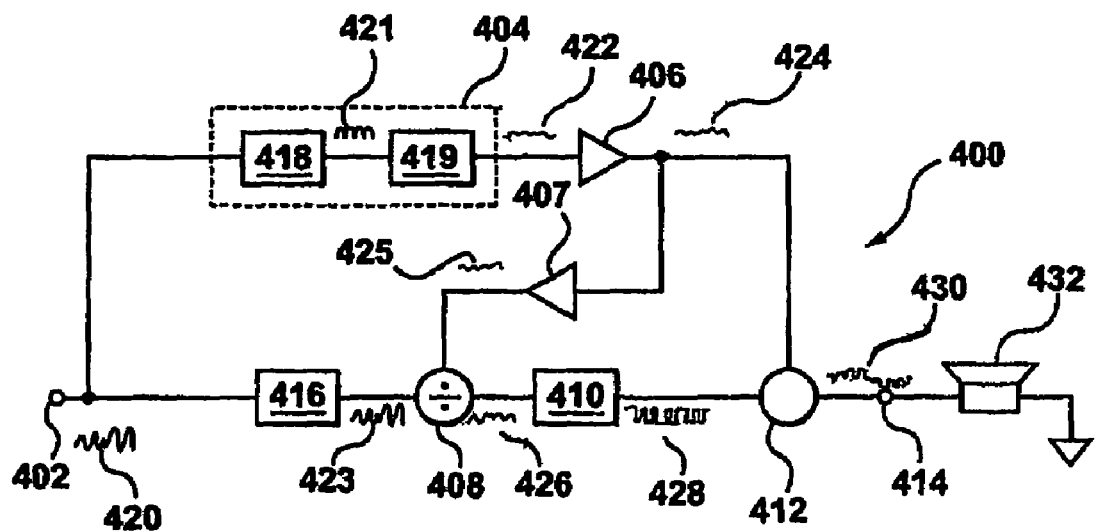
FIG. 5 illustrates a fourth amplifier according to the present invention.
Figure 6:
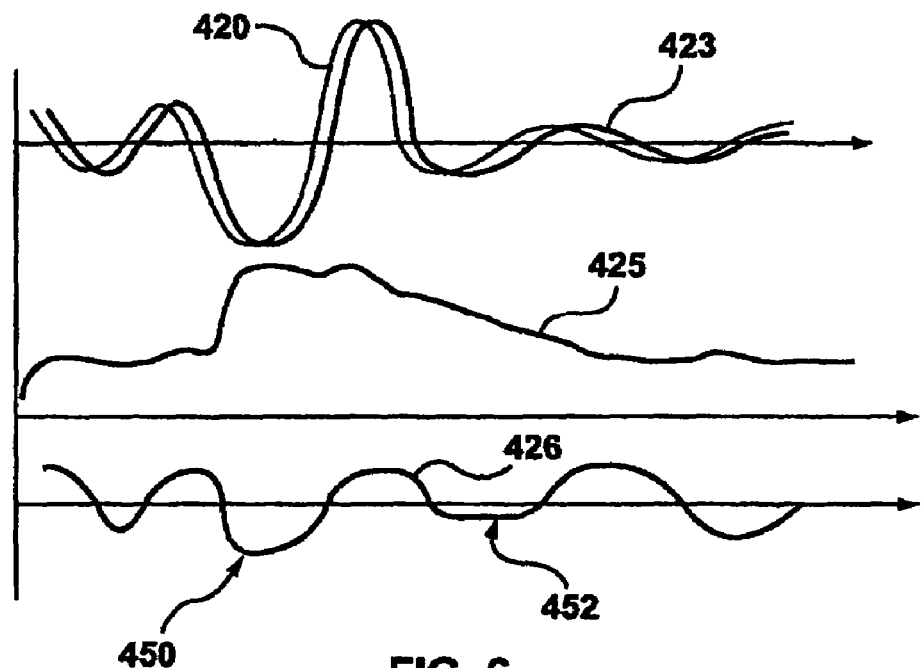
FIG. 6 illustrates several exemplary signals in the amplifier of FIG. 5.

Reference is next made to FIGS. 5 and 6. FIG. 5 illustrates a fourth amplifier 400 according to the present invention. FIG. 6 illustrates several exemplary signals generated in amplifier 400. Components of amplifier 400 that correspond to similar elements of the amplifier described above are identified with similar reference numerals. Reference generator 404 receives input signal 420 and provides a voltage regulator reference 422. Reference generator 404 includes a rectifier 418 and a peak detector 419 coupled between input terminal 402 and voltage regulator 406. Reference generator 418 provides a rectified version 421 of input signal 420. Peak detector 419 receives this rectified version of the input signal 420 and provides a voltage regulator reference 422 that corresponds to the envelope of input signal 420. Voltage regulator 406 provides a power signal 424 corresponding to the envelope of the rectified input signal 421.

An optional delay block 416 is coupled between input terminal 402 and feedback compensation block 408. Delay block 416 provides a delayed input signal 423 that tracks the input signal 420 but is delayed in time. Amplifier 400 utilizes a feedback compensation mechanism rather than the feed-forward compensation mechanism of amplifiers 100, 200 and 300. Power signal 424 is coupled to feedback compensation block 408 through a scaler 407. Scaler 407 scales the power signal 424 to provide a scaled power signal 425. In the present embodiment, feedback compensation block 408 is a divider. Feedback compensation block 408 generates a modulation control signal 426 equal to:

$$\text{Modulation Control Signal } 426 = \frac{\text{Delayed Input Signal } 423}{\text{Scaled Power Signal } 425}.$$

In a practical embodiment of an amplifier according to the present invention, as the input signal 420 is processed through the rectifier 418, the peak detector 419 and the voltage regulator 406, a delay will be introduced between the power signal 424 and the input signal 420. Delay block 416 serves to the delay the input signal so that the delayed input signal 423 is synchronized (or is approximately synchronized) in time with the scaled power signal 425. The delay introduced by delay block 416 may also take into account any delay in scaler 407 and other relevant components of the amplifier.

In another embodiment of the invention, a phase shift block could be coupled between the input terminal 402 and the regulator generator 404. In this case, delay block 416 could be omitted. In another embodiment, a phase shift block could be coupled between the regulator reference generator 404 and voltage regulator 406.

In another embodiment of the invention, scaler 407 may be coupled between the output of regulator reference generator 404 and compensation block 408.

FIG. 6 illustrates several exemplary signals in amplifier 400. The signals are not illustrated to scale. At the top of FIG. 6, an exemplary input signal 420 is illustrated. Voltage regulator reference 422 (not shown in FIG. 6) generally follows the envelope of the rectified input signal 421 (not shown in FIG. 6). The peak detector 419 will have attack and release characteristics. These characteristics of the peak detector are discussed in greater detail below. The voltage regulator 406 will have a slew rate and regulation characteristics that limit the precision with which the power signal 424 tracks the voltage regulator reference 422.

A corresponding scaled power signal 425 is also shown.

The delayed input signal 423 corresponds to the input signal 420 and tracks slightly behind it. A skilled person will recognize that the delay period of delay block 416 will not precisely synchronize the delayed input signal and the power signal since the delay in the power signal will depend on the characteristics of the rectifier 418, the peak detector 419 and the voltage regulator 406. These characteristics may be magnitude and frequency dependent, with the result that different components of the input signal may be delayed differently.

Modulation control signal 426 is generated by dividing the scaled power signal 425 into the delayed input signal 423.

The modulation control signal 426 serves two purposes.

First, it preserves the sign of delayed input signal. If the amplifier implements a push-pull output stage (as illustrated in amplifier 200 (FIG. 2)), then the sign indicates whether the output stage should be in a "push" configuration (with the positive voltage signal coupled to the output terminal) or in a "pull" configuration (with the negative voltage signal coupled to the output terminal). If the amplifier implements a bridge output stage (as illustrated in amplifier 300 (FIG. 4)), then the sign indicates the direction in which current should flow through the load. A push-pull or bridge output stage may optionally be used with different amplifiers described herein.

Second, the modulation control signal indicates the proportion of the power signal (or power signals when there are multiple power rails) that should be coupled to the output terminal. In a practical system according to the invention, the power signal will be generated to be larger than the magnitude of the desired output signal 430, thereby providing some headroom in the output stage 412. For example, if the input signal has a magnitude of 0.65 volts and the desired output signal has a magnitude of 20 volts, then the power signal may be generated with a magnitude of 25 volts. The modulated signal is generated so that the magnitude of the output signal will be 20 volts, thereby providing for 5 volts or 20% of headroom between the power signal and the output signal. In effect, the duty cycle of the modulated signal is 80%. This ratio of 80% may be considered a target ratio in an amplifier with these exemplary characteristics. Other amplifiers according to the invention may have different headroom and duty cycle targets.

The modulation block compares the scaled power signal with the magnitude of the delayed input signal. If the actual power signal is at the correct magnitude to provide the desired output signal (with the desired headroom), then the modulated control signal is generated so that the duty cycle of the modulated signal will be at the target ratio.

However, if the power signal is at a lower magnitude than desired, then the magnitude of the modulated control signal is larger, thereby increasing the duty cycle of the modulated signal and compensating for the low level of the power signal. Using the example above, if the desired output signal level is 20 volts with a 20% headroom, but the power signal has a magnitude of only 23.5 volts, then the duty cycle of the modulated signal may be increased to 85.1%, thereby providing an output signal with a magnitude of 20 volts. An example of this condition is illustrated in FIG. 6 at 450. The condition may arise because the peak detector or the voltage regulator (or both) does not attack quickly enough when the magnitude of the input signal rises.

If the scaled power signal is at a lower magnitude than desired, the magnitude of the modulation control signal is smaller, thereby reducing the duty cycle of the modulated signal and compensating for the high level of the power signal. Using the above example again, if the desired output signal level is 16 volts with a 20% headroom, but the power signal has a magnitude of 22 volts (rather than the target magnitude of 20 volts), then the duty cycle of the modulated signal may be reduced to 72.7%, providing an output signal of 16 volts. This condition is illustrated in FIG. 6 at 452. The condition may arise if the peak detector releases slowly or the slew rate of the voltage regulator slows the decrease of the magnitude of the power signal, thereby holding the power signal at a higher level than is needed to generate the output signal with the desired magnitude.

The attack and release characteristics of the peak detector are chosen taking the following criteria into account. The peak detector should preferably (although not necessarily) attack quickly enough to avoid a modulation index greater than 1, which would result in undesirable clipping of the output signal. The peak detector should also release slowly enough to reduce the appearance of undesired audio frequency components in the power signal. In amplifier 400, the feedback compensation mechanism provides some power supply rejection, reducing the effect of power supply inaccuracy and delay on the output signal. If the peak detector releases too quickly, the regulator reference may too closely follow the rectified input signal and the power signal will include audio frequency components. The feedback compensation mechanism may not be able to fully compensate for this, resulting in distortion in the output signal.

One of the advantages of the present invention is that the magnitude of the power signal tracks the magnitude of the output signal. This can allow the headroom between them to be less than in some prior art systems, thereby increasing the power efficiency of the amplifier. The peak detector should release sufficiently quickly to preserve this benefit of the invention.

A power signal in a practical system may also have other characteristics such as a minimum magnitude or an offset voltage. The reference generator or the voltage regulator (or both) could be configured to implement these characteristics. An amplifier according to the present invention will be able to generate a modulation control signal to compensate for these characteristics. In a feed-forward compensation configuration, the compensation block may be programmed to compensate for such characteristics. In a feedback compensation configuration, the compensation block will compensate for such characteristics when comparing the scaled power signal with the delayed input signal to generate the modulation control signal.

Figure 7:
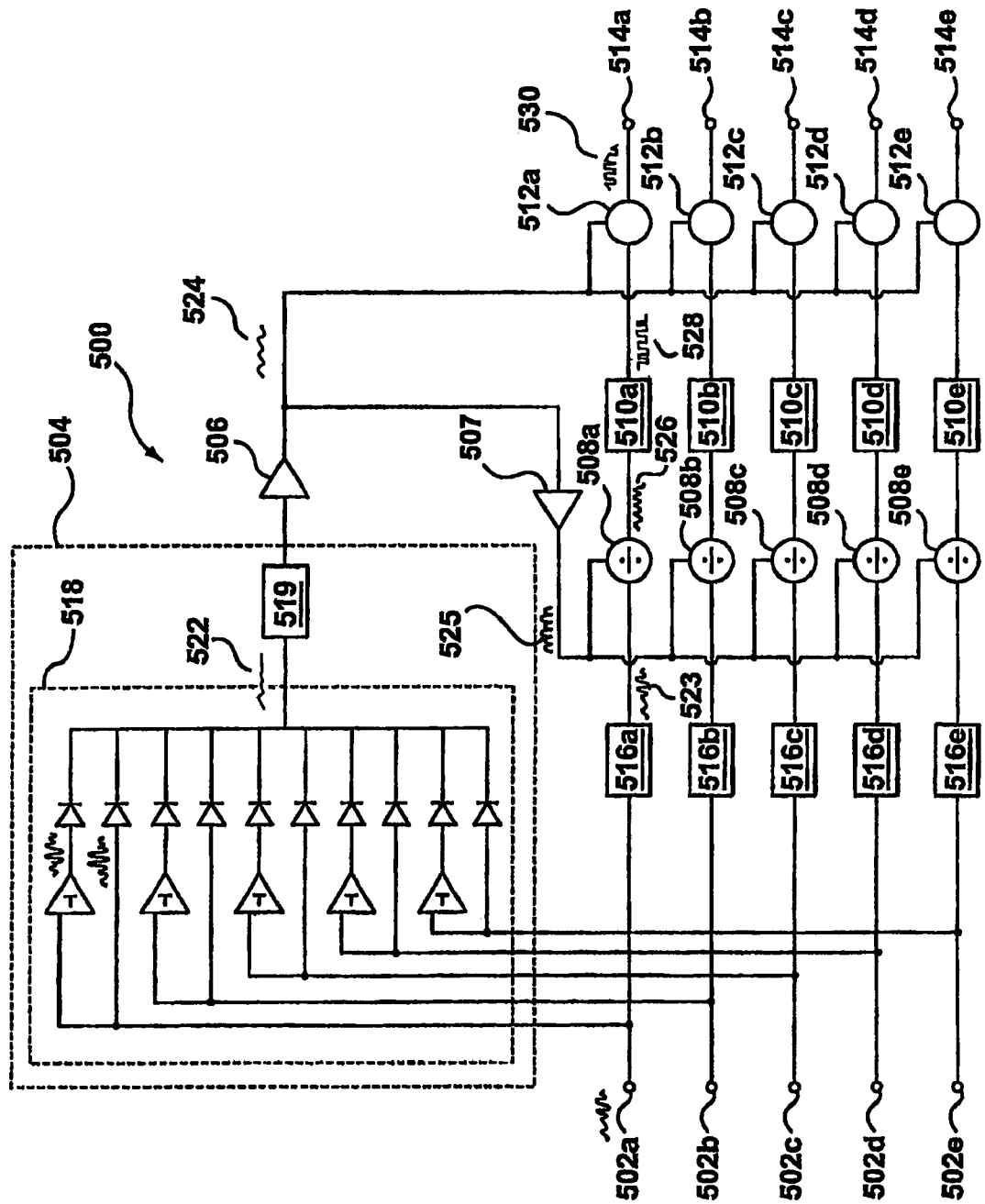
FIG. 7 illustrates a fifth amplifier according to the present invention.

Amplifiers 100, 200, 300, 400 are illustrated with a single input terminal and a single output terminal. The present invention is also suitable for use with a multi-channel audio system. Reference is next made to FIG. 7, which illustrates an amplifier 500 according to the present invention. Amplifier 500 can amplify five signals or channels a-e. Amplifier 500 has five input terminals 502a-502e at which five input signals 520a-520e are received. (For clarity, only signals relating to channel a are illustrated.) Amplifier 500 has a rectifier 518 which full wave rectifies each input signal 520 and also diode-ors the signals to provide a rectified signal 521 which, at any time, has a magnitude corresponding to the input signal 520 with the highest magnitude. A peak detector 519 provides a voltage regulator reference 522 corresponding to the envelope of rectified signal 521. Voltage regulator 506 provides an amplified power signal 524, which is coupled to an output stage 512 for each channel.

For each channel, there is a delay block 516, feedback compensator 508, modulator 510, an output stage 512 and an output terminal 514, which operate on the input signal for that channel in the same manner as describe above in relation to amplifier (FIG. 5).

Voltage regulator 506 generates a power signal with a sufficient magnitude to generate the output signal (524a to 524e) that is to have the highest magnitude (and which typically corresponds to the input signal with the highest magnitude). The remaining output signals will typically have a smaller magnitude (corresponding to input signal with a comparatively smaller magnitude). To facilitate this, the feedback compensation block 508 for each channel generates a modulation control signal 526 that reflects the desired magnitude and sign of the output signal 524 for that channel. The modulator 510 for each channel generates a modulated signal 528 corresponding to the modulation control signal 526 for that channel. As described above in relation to amplifier 400, the modulation control signal 526 for each channel will direct the modulator 510 to produce a modulated signal 528 with an appropriate duty cycle to provide an output signal 530 for that channel with the desired magnitude.

Amplifier 500 is one example of a multi-channel amplifier that may be implemented with the present invention. The other amplifiers described above and below may also be used to implement multi-channel amplifiers.

Figure 8:
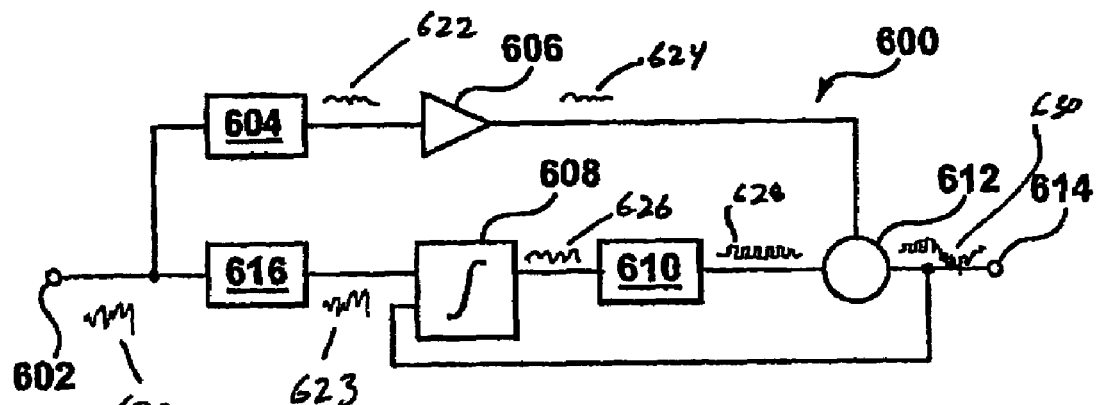
FIG. 8 illustrates a sixth amplifier according to the present invention.

Reference is next made to FIG. 8, which illustrates another amplifier 600 according to the present invention. (In FIG. 8 and in subsequent Figures, various signals that correspond to previously illustrated and described signals are not illustrated again.) Amplifier 600 includes a reference generator 604 and a voltage regulator 606 which operate to produce a power signal 624. Reference generator 604 may be constructed in the same manner as the reference generators of amplifiers 300 or 400. Amplifier 600 includes a feedback compensation block 608 to generate a modulation control signal 626. Feedback compensation block 608 receives a delayed input signal 623 and an output audio signal 630 and generates a modulation control signal 626 equal to:

Modulation Control Signal 626=∫(Delay Input Signal 623−Output Signal 630)*dt*.

Figure 9:
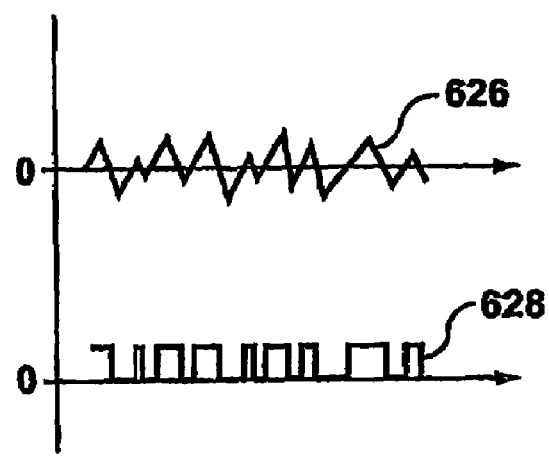
FIG. 9 illustrates several signals of the amplifier of FIG. 8.

FIG. 9 illustrates an exemplary modulation control signal 626 and a corresponding modulated signal 628. Modulator 610 generates a modulated signal 628 by comparing the modulation control signal 626 to a threshold, which may be zero. When the modulation control signal is greater than the threshold, the modulator 610 generates a modulated signal 628 with a positive pulse. Conversely, when the modulation control signal is less than the threshold, the modulator 610 generates a modulated signal 628 with a negative pulse. The actual modulated signal generated by the modulator will depend on the modulation technique selected for the amplifier. In amplifier 600, the modulation control signal 626 is generated based on the output audio signal 630 rather than the power signal 628. This allows inaccuracies in the output audio signal 630 that may be introduced by output stage 612 through the feedback compensation loop comprising feedback compensation block 608 to be compensated for. Further, this implementation may be simpler to implement than a divider and no ramp is required in modulator 610.

Figure 10:
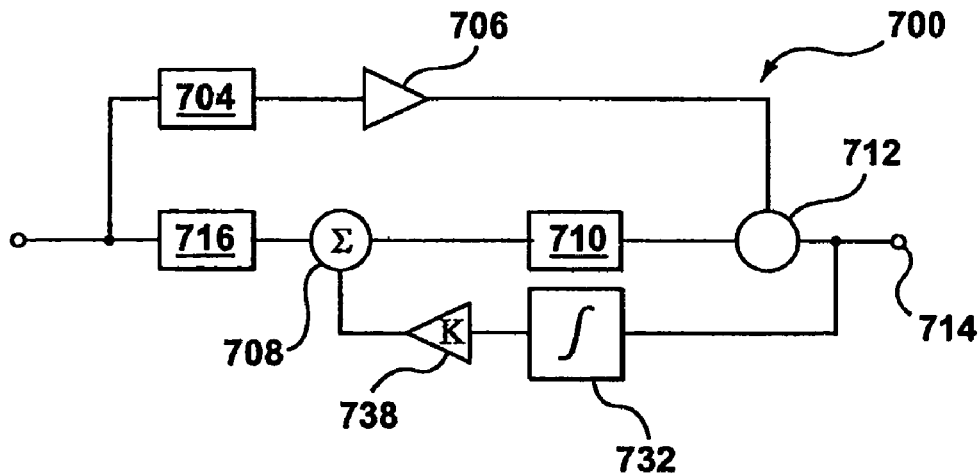
FIG. 10 illustrates a seventh amplifier according to the present invention.

Reference is next made to FIG. 10, which illustrates another amplifier 700 according to the present invention. Amplifier 700 also uses a feedback compensation mechanism to generate, a modulated signal 728. A delayed input signal 723 is generated by delay block 716. The output audio signal 730 is integrated through an integrator 732 to produce an integrated output signal 734. The integrated output signal is scaled through a scaler 736 to produce a scaled integrated output signal 738. The scaling factor K of scaler 736 is selected to reduce the magnitude of the integrated output signal 734 to a magnitude suitable for comparison with the delayed input signal 723. A summer 708 produces a modulation control signal 726 equal to:

Modulation Control Signal 726=Delay Input Signal 723−*K* ∫Output Signal 730 *dt*.

Figure 11:
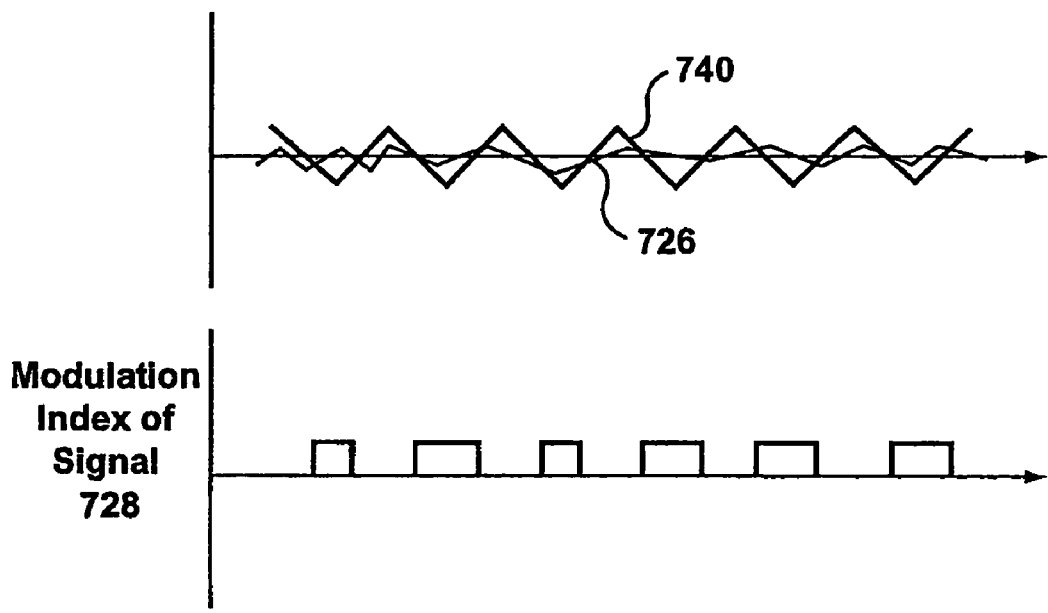
FIG. 11 illustrates several signals of the amplifier of FIG. 10.

Modulator 710 is configured to compare the modulation control signal 726 to a triangle wave 740 (or saw tooth wave) generated internally in the modulator. When the modulation control signal is higher than the triangle wave 740, a positive pulse is generated. When the modulation control signal is smaller than the triangle wave 740, a negative pulse is generated. As described above, the form of the modulated signal 728 will be dictated by the modulation scheme that has been selected for the particular amplifier. The modulation control signal 726, triangle wave 740 and the modulation index of the modulated signal 728 are illustrated in FIG. 11.

Amplifier 700 includes a full wave rectifier 718 (not shown) and a peak detector 719 (not shown) within reference generator 704 and a single power regulator 706. The power regulator 706 may be configured to produce symmetric positive and negative power signals for use with a push-pull output stage (as is illustrated in amplifier 200 (FIG. 2)) or to produce a single power signal if the amplifier will include a bridge output stage (as is illustrated in amplifier 300 (FIG. 4)).

Figure 12:
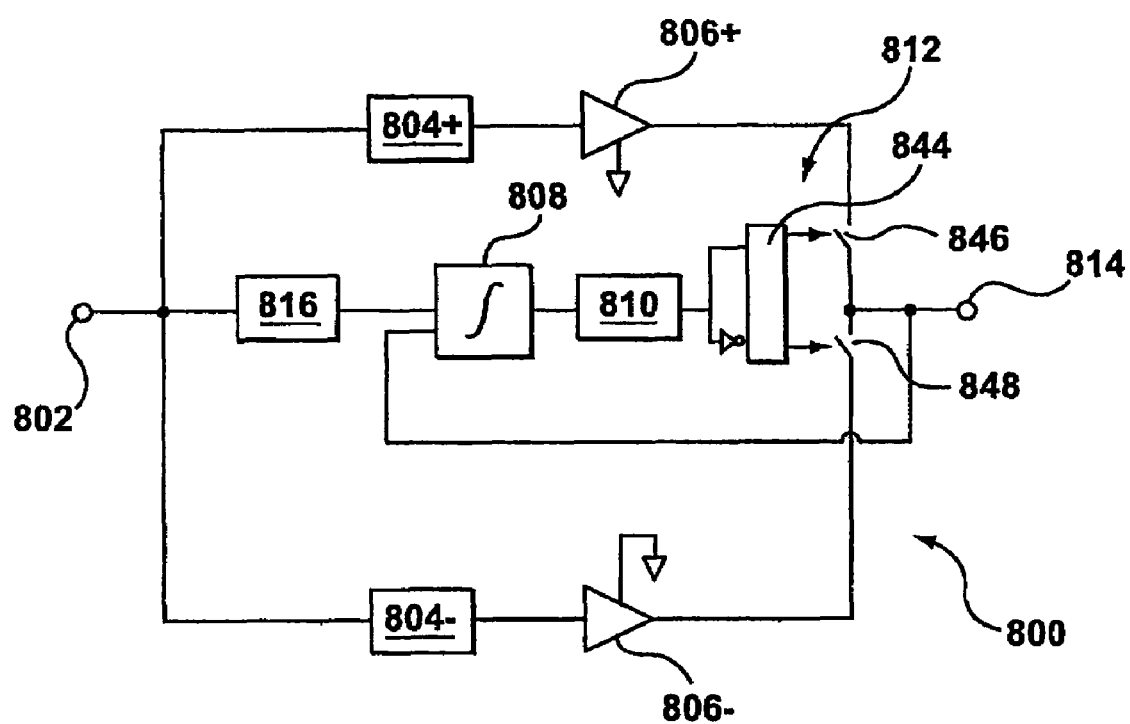
FIG. 12 illustrates an eighth amplifier according to the present invention.

Reference is next made to FIG. 12, which illustrates an amplifier 800 according to the invention in which separate positive and negative power signals are produced for use with a push-pull output stage.

Amplifier 800 includes two half wave rectifiers 804+ and 804−. Rectifier 804+ is coupled between input terminal 802 and voltage regulator 806+. Rectifier 804+ half wave rectifies an input signal 820 received at the input terminal 802 and provides a positive regulator reference 822+ corresponding to the positive half-waves of input signal 820. Rectifier 804− similarly produces a negative regulator reference 822− corresponding to the negative half-waves of input signal 820 to voltage regulator 806−.

Voltage regulator 806+ produces a positive power signal 824+ that is coupled to output terminal 814 through switch 846. Positive power signal 824+ corresponds to the positive regulator reference 822+ and accordingly comprises a series of positive going half waves.

Voltage regulator 806− similarly produces a negative power signal 824− that is coupled to output terminal 814 through switch 848. Negative power signal 824− corresponds to the negative regulator reference 822− and accordingly comprises a series of negative going half waves.

Delay block 816 and feedback compensation block 808 operate in the same manner as the delay block 516 and feedback compensation block 508 of amplifier 500 (FIG. 7). Modulator 810 generates a modulated signal 828 that is used to control switches 846 and 848 through a gate drive circuit 844, as described above in relation to amplifier 300 (FIG. 4).

Amplifiers 100-800 have been illustrated without details of the power supply for the voltage regulator.

Figure 13:
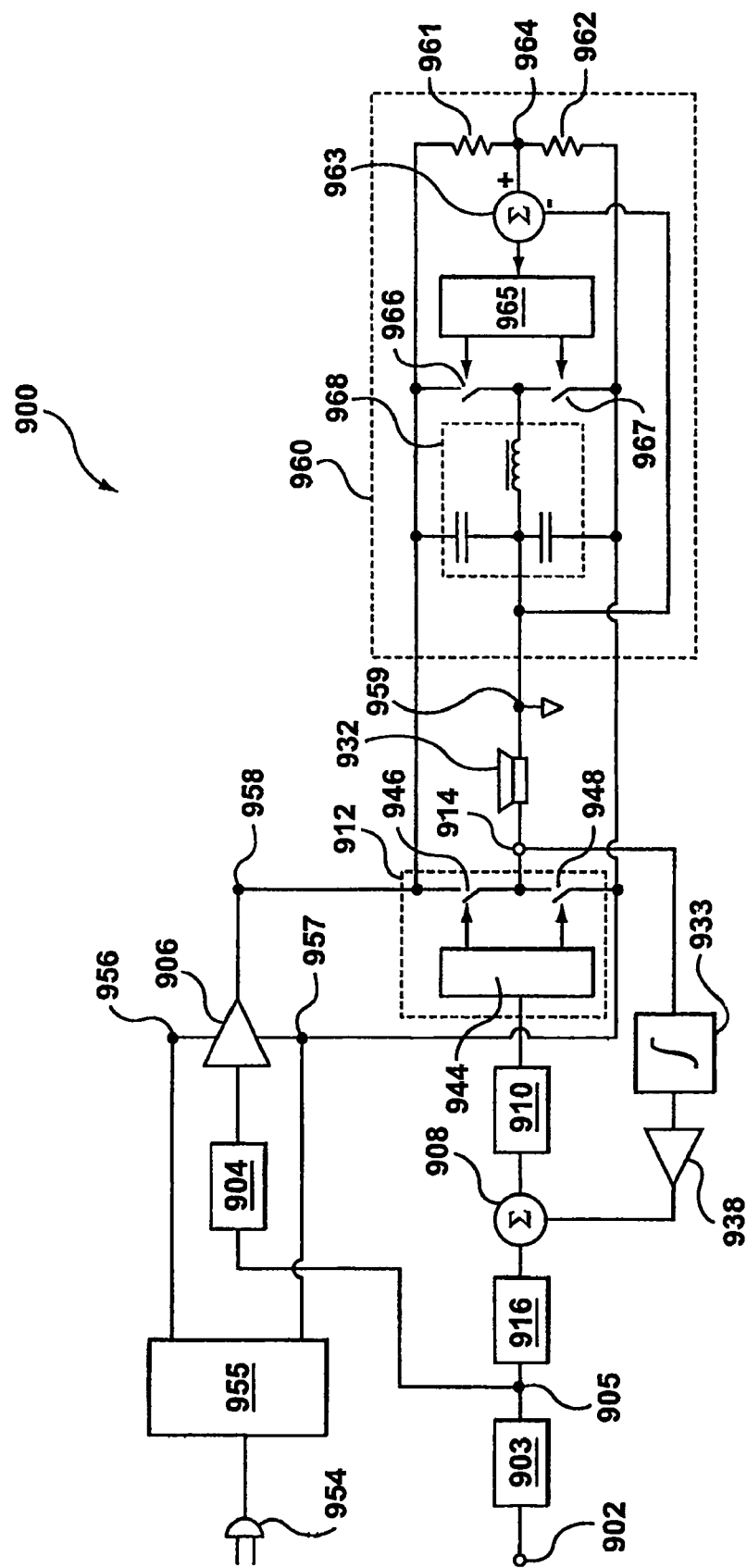
FIG. 13 illustrates a ninth amplifier according to the present invention.

An amplifier according to the present invention may be implemented as part of a stand-alone speaker, such as a powered subwoofer. Reference is next made to FIG. 13, which illustrates an amplifier circuit 900 suitable for use in a stand-alone speaker.

Amplifier 900 receives an input signal 920 at an input terminal 902. A safety isolation block 903− is coupled between input terminal 902 and a node 905. The safety isolation block 903 provides physical isolation between input terminal 902 and node 905. The safety isolation may be provided in safety isolation block 903 using optical isolation, RF isolation, an isolation transformer or any other technique for physically isolating two nodes in an electrical circuit. Safety isolation block 903 provides an isolated input signal (not shown) at node 905.

The isolated input signal is received by a voltage regulator reference generator 904, which provides a voltage regulator reference 922 to voltage regulator 906. Voltage regulator 906 receives power from a DC power supply 955. DC power supply 955 may be plugged into a typical AC municipal power source (or another AC power source) through a plug 954. DC power supply 955 rectifies the AC power signal provided by the AC power source and provides a DC rectified power supply to the voltage regulator 906 across nodes 956 and 957. Voltage regulator 906 provides a power signal 924 at node 958 in response to reference 922. When measured across nodes 958 and 957, the power signal 924 has a magnitude of twice the desired magnitude for the output signal 930 at output terminal 914 (plus any headroom and taking into account characteristics of a peak detector and voltage regulator).

Delay block 916 is coupled between node 905 and a feedback compensation block 908. A feedback compensation loop including an integrator 933, scaler 938 and feedback compensation block 908 operate as described above in relation to amplifier 700 (FIG. 10) to provide a modulation control signal 926 to modulator 910. Modulator 910 provides a modulated signal 928 in response to the modulation control signal 926. The modulated signal 928 is received by a push-pull output stage 912 comprising a gate drive block 944 and a pair of switches 946 and 948. Gate drive block 944 operates switch 946 in response to the original form of modulated signal 928 and operates switch 948 in response to an inverted form of modulated signal 928, which is generated internally in the gate drive block.

The push-pull output stage 912 provides the output signal 930 at terminal 914. A speaker 932 is coupled between terminal 914 and a reference node 959. Node 959 is designated as a reference ground for amplifier 900, thereby effectively splitting the power signal 924 about the reference ground and allowing the output stage to operate in a push-pull configuration.

Amplifier 900 also includes an active ground circuit 960. Active ground circuit includes a pair of resistors 961 and 962 of equal magnitude couple across nodes 958 and 957. A summer 963 is coupled between the resistors at node 964. Resistors 961 and 962 split the power signal providing a reference center point for the reference ground at node 964. Summer 963 is also coupled to the reference ground at node 959 and provides an error signal equal to the difference between the voltages at nodes 964 and the reference ground. A gate drive block 965 operates a pair of switches in response to the error signal, coupling either node 958 or node 957 to the reference ground at node 959, through a filter 968. Gate drive block 965 may be implemented as a saw-tooth or triangle wave generator and a comparator. The saw-tooth or triangle wave is centered about the reference ground. If the reference ground has a voltage higher than the reference point at node 964, then the reference ground is pulled toward the lower voltage at node 957 by closing switch 967. Conversely, if the reference ground has a voltage lower than the reference point at node 964, the reference ground voltage is increased by closing switch 966. Through this process, the active ground circuit 960 actively maintains the reference ground centered between the voltages at nodes 958 and 957.

In an amplifier with a push-pull output stage, such as output stage 912, only one switch (switch 946 or 948) is closed at any point in time and only one power rail (at either node 958 or node 957) is connected to the load (speaker 932). The power rail that is not connected to the load may climb in magnitude due to charge pumping. The active ground circuit 960 mitigates this effect. The reference ground is not fixed but moves to be centered between the positive and negative voltage rails. By forcing an equal split between the two rails, the charge pumping current is effectively cancelled.

Figure 14:
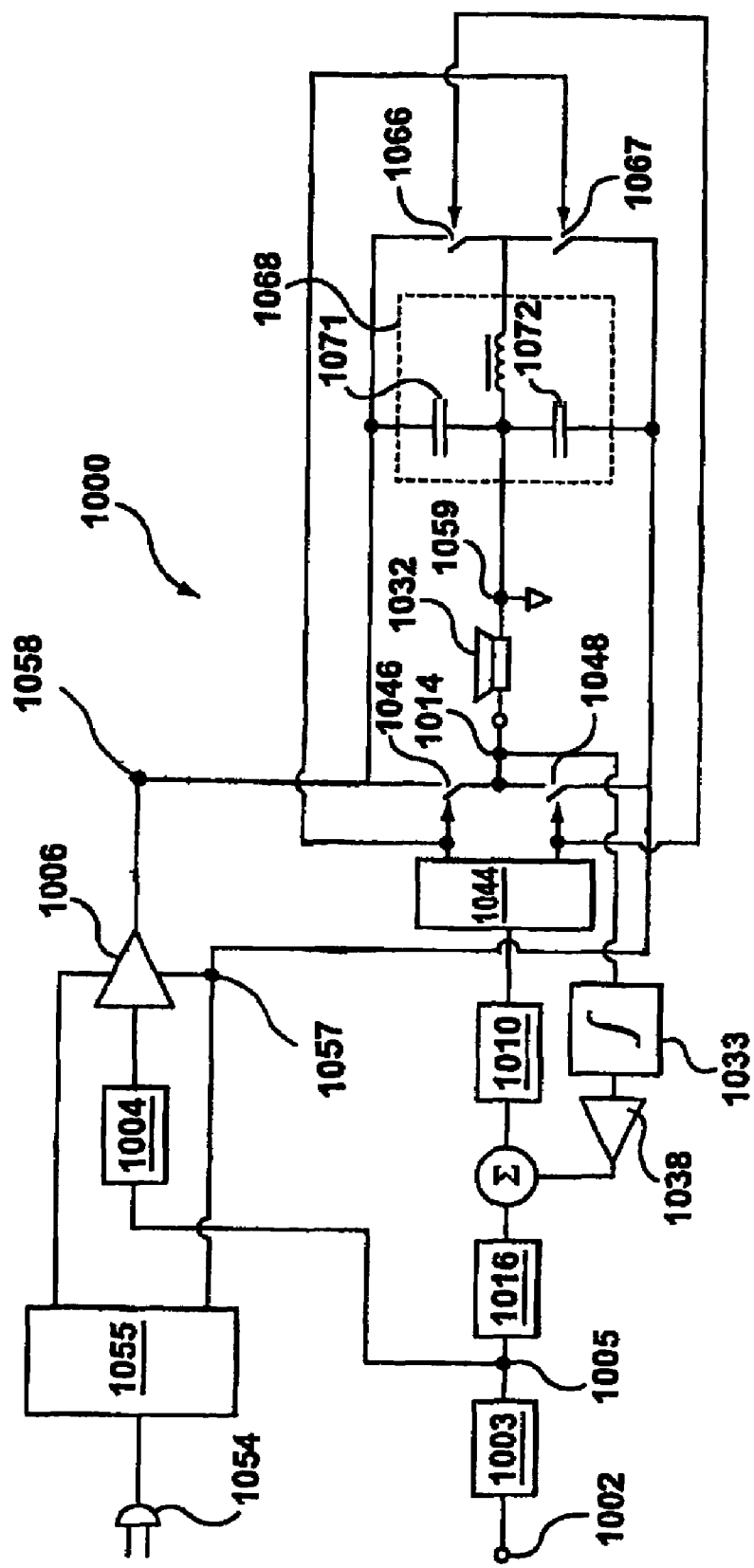
FIG. 14 illustrates a tenth amplifier according to the present invention.

Reference is next made to FIG. 14, which illustrates another amplifier 1000 according to the present invention that may be powered from an external AC power source.

Amplifier 1000 does not have an active ground circuit. Instead switch 1066 is switched together with switch 1048. Switch 1067 is switched together with switch 1046. This has the effect of offsetting the reference ground at node 1059, as follows. In FIG. 14, gate drive block 1044 is illustrated as being directly coupled to switches 1066 and 1067. In an alternative embodiment, a separate gate drive block may be provided for switches 1066 and 1067. The separate gate drive block could be driven by the outputs of gate drive block 1044 or by the modulated signal 1028 produced by modulator 1010.

Figure 15:
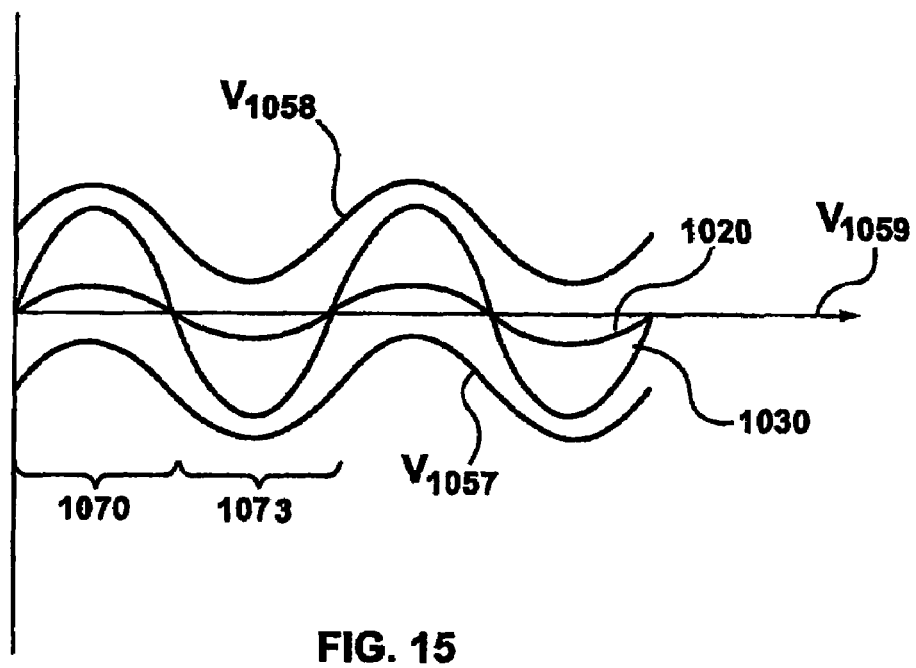
FIG. 15 illustrates several signal of the amplifier of FIG. 14.

Reference is also made to FIG. 15, which illustrates this offsetting effect. FIG. 15 illustrates the voltage $V_{1058}$ at node 1058, the voltage $V_{1057}$ at node 1057, the magnitude of the output signal 1030 measured at output terminal 1014 and the magnitude of the input signal 1020 measured at input terminal 1002. Each of these signals is measured relative to the reference ground at node 1059.

To generate a positive going output signal, as shown during time period 1070, the output terminal 1014 is coupled to power signal 1024 at node 1058 for more time than the output terminal 1014 is coupled to node 1057. This is done by closing switch 1046 for more time than switch 1048. When switch 1046 is closed, switch 1067 is also closed. Closing switch 1067 has the effect of reducing the voltage across capacitor 1072. On FIG. 15, this is illustrated by $V_{1057}$ rising towards the reference ground on node 1059. At the same time, the voltage across capacitor 1071 increases (since the potential between nodes 1058 and 1057 is determined by the magnitude of the audio output signal 1024). This is illustrated by $V_{1058}$ rising relative to the reference ground.

Conversely, when switch 1048 is closed, switch 1066 is closed and switch 1067 is open. This is illustrated during time period 1073. The voltages at nodes 1058 and 1057 are offset to lower voltages relative to reference ground.

By offsetting the voltages at nodes 1058 and 1057 in synchronization with the output signal 1030, the output signal can be generated with large voltage swing, and a correspondingly larger power output, than would be possible if voltage at nodes 1058 and 1057 were symmetrical about the reference ground at node 1059. Typically, switches 1046 and 1048 will be implemented as power transistors.

Amplifier 1000 also mitigates the problem of charge pumping and also reduces the voltage stress on transistors 1046, 1048, 1066 and 1067 by up to a factor of 2.

Other control schemes may be used to control the operation of switches 1066 and 1067 to offset the voltages at nodes 1058 and 1057.

Figure 16:
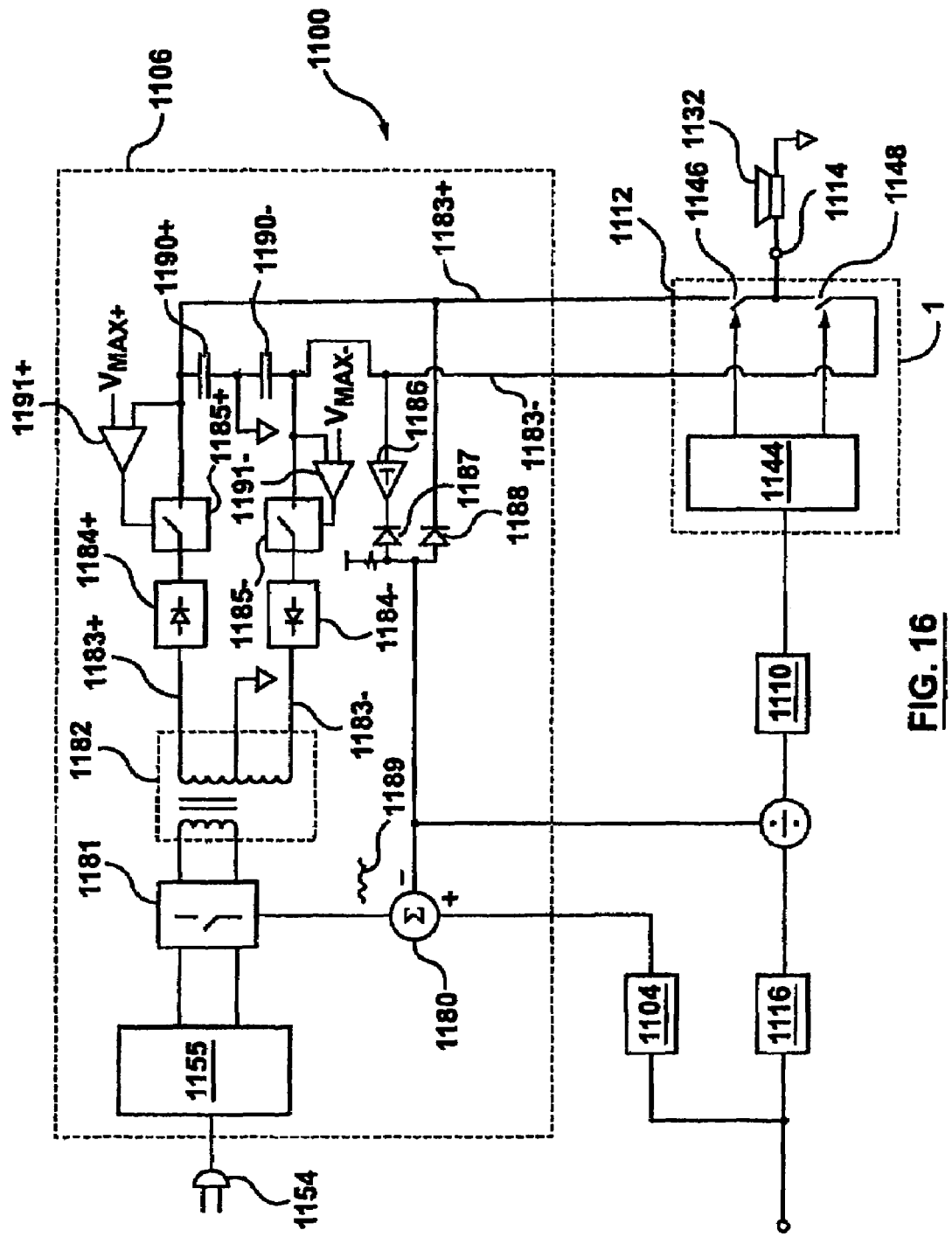
FIG. 16 illustrates an eleventh amplifier according to the present invention.

Reference is next made to FIG. 16, which illustrates another amplifier 1100 according to the present invention. Amplifier 1100 has a push-pull output stage 1112 and uses the feedback compensation scheme described above in relation to amplifier 400 (FIG. 5). Amplifier 1100 has a voltage regulator 1106 that receives an AC power signal from an AC power source at a plug 1154. The AC power is rectified through a rectifier 1155 to provide a DC power signal. A switch 1181 receives the DC power signal and provides a regulated DC power signal to a transformer 1182. Transformer 1182 has a split secondary winding and provides a positive voltage rail $1183_+$ through a positive going half wave rectifier $1184_+$ and a switch $1185_+$. Transformer 1183 also provides a negative voltage rail $1183_-$ through a negative going half wave rectifier $1184_-$ and a switch $1185_-$. The positive voltage rail $1183_+$ and negative volt rail $1183_-$ are coupled through a pair of filtering capacitors $1190_+$ and $1190_-$.

The voltages of rails $1183_+$ and $1183_-$ is regulated through a feedback loop. The negative voltage rail is inverted through an inverter 1186 and the inverted negative rail is diode-or'd with the positive rail by diodes 1187 and 1188. The lower of the two rails is compared to the regulator reference 1122 generated by regulator reference generator 1104 to provide a voltage rail error signal 1189. The voltage rail error signal 1189 is used to control switch 1181, thereby regulating the voltage on rails $1183_+$ and $1183_-$. The error signal may be passed through an opto-coupler or RF coupler (not shown) to provide physical isolation of the input terminal and output terminal from the plug 1154. Alternatively, gate control signals generated from the error signal could be coupled to the switch 1181 through an isolation mechanism.

In use, only one of the positive voltage rail $1183_+$ or the negative voltage rail $1183_-$ will be coupled to the output terminal 1114 and the load 1132. The voltage on the rail 1183 that is not loaded will tend to rise as the corresponding capacitor 1190 become charged due to non-ideal characteristics of the power circuit, such as the leaking inductance in the transformer, DC resistance of the transformer and other factors. Switches 1185 are used to address this. The positive voltage rail $1183_+$ is coupled to a comparator $1191_+$ that compares the voltage on the positive voltage rail $1183_+$ to a maximum voltage $Vmax_+$. If the voltage on the positive voltage rail exceeds the maximum voltage, the comparator opens switch 1185, stopping the current flow to capacitor $1190_+$ and limiting the voltage on the positive voltage rail to $Vmax_+$. The voltage on the negative voltage rail $1183_-$ is similarly limited to a minimum voltage $Vmax_-$ through comparator $1191_-$.

By limiting the voltage on the rail that is not coupled to the load, amplifier 1100 allows a single point of control at the primary side of transformer 1181 to be used to regulate the voltage on both the positive and negative voltage rails.

The voltages on the positive and negative voltage rails may also be limited using other techniques. For example, a voltage clamp may be coupled to between each voltage rail and ground; a cross regulator may be used to transfer current from one rail to the other or a linear or post regulator may be inserted between each voltage rail and the output stage 1112 to limit the voltage on the rails. Also, the active ground circuit 960 (FIG. 13) could be used for the same purpose. These alternatives also permit a an inductor to be coupled in each of the voltage rails between the respective rectifiers 1184 and the capacitor 1190, which may be desirable in some voltage regulation schemes.

Figure 17:
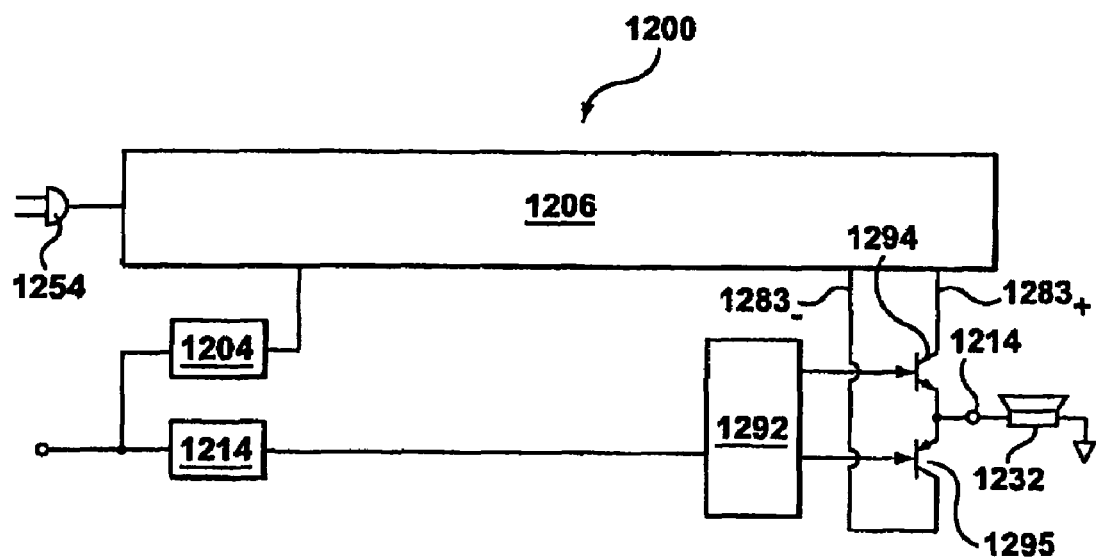
FIG. 17 illustrates a twelfth amplifier according to the present invention.

Reference is next made to FIG. 17, which illustrates another amplifier 1200 according to the present invention. The voltage regulator of amplifier 1100 may be used with other types of amplifiers. Amplifier 1200 includes a voltage regulator 1206 that is identical to voltage regulator 1106 and accordingly is not illustrated in detail. The voltage regulator 1206 is used to power a linear amplifier 1212. Amplifier 1212 includes an analog drive stage 1292 and an output stage 1293 comprising a pair of transistors 1294 and 1295. Analog driver stage 1292 receives the delay input signal from delay block 1216 and drives the transistors in response to it. Amplifier 1200 does not include a compensation block.

Figure 18:
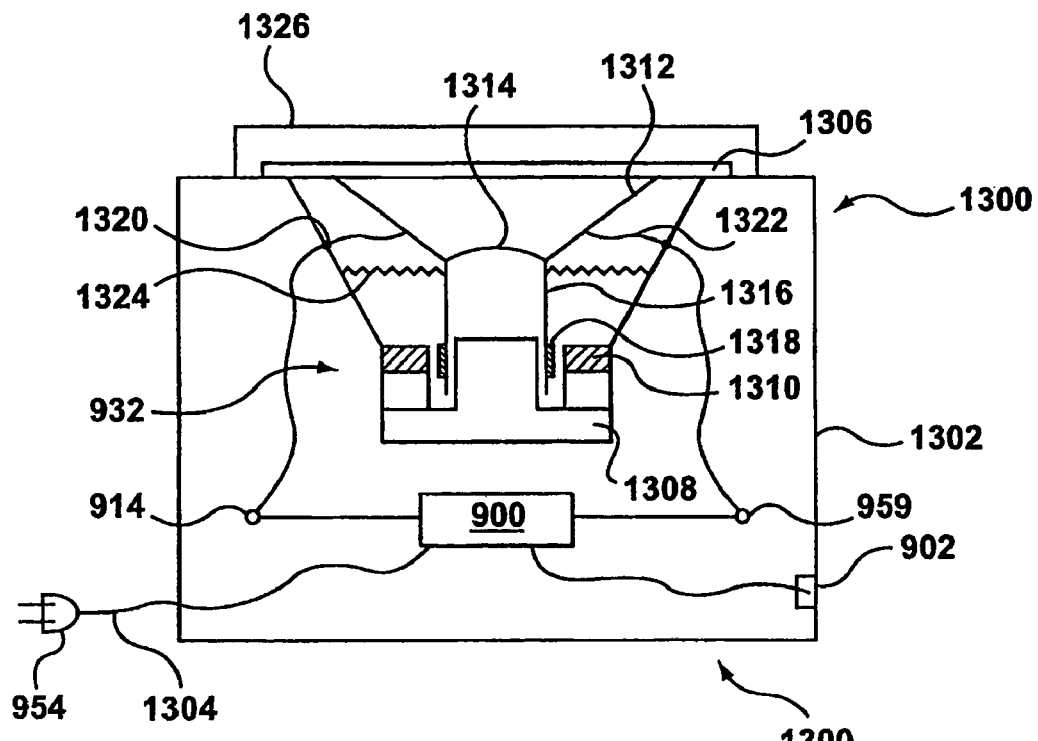
FIG. 18 is a cross-sectional drawing illustrating a first speaker assembly and a first speaker according to the present invention.

Reference is next made to FIG. 18, which illustrates a speaker assembly 1300 that includes amplifier 900 (FIG. 13). Speaker assembly 1300 includes a speaker 932 coupled across output terminal 914 and reference ground 959. The input terminal 902 of amplifier is mounted on the housing 1302 of speaker assembly 1300. Plug 954 is also illustrated and is coupled to the rest of amplifier 900 by a cord 1304. The remaining components of amplifier 900 are not separately illustrated.

Speaker 932 includes a basket 1306 that is mounted to the speaker assembly housing 1302. The components of speaker 932 are mounted on the basket 1304. Speaker 932 includes a platform 1308 on which a magnet 1310 is mounted. Speaker 932 has a diaphragm 1312 and a dust cap 1314. Diaphragm 1312 is coupled to a voice coil former 1316 on which a voice coil is 1318 is wound. The ends of the voice coil terminate in voice coil leads 1320 and 1322. The voice coil leads are coupled to output terminal 914 and to node 959 to receive the output signal 930 (FIG. 13) produced by amplifier 900. A spider 1324 supports moving components of speaker 932, including the diaphragm 1312, dust cap 1314, voice coil former 1316 and voice coil 1318. Speaker 932 operates in conventional fashion in response to the output signal 930.

Figure 19:
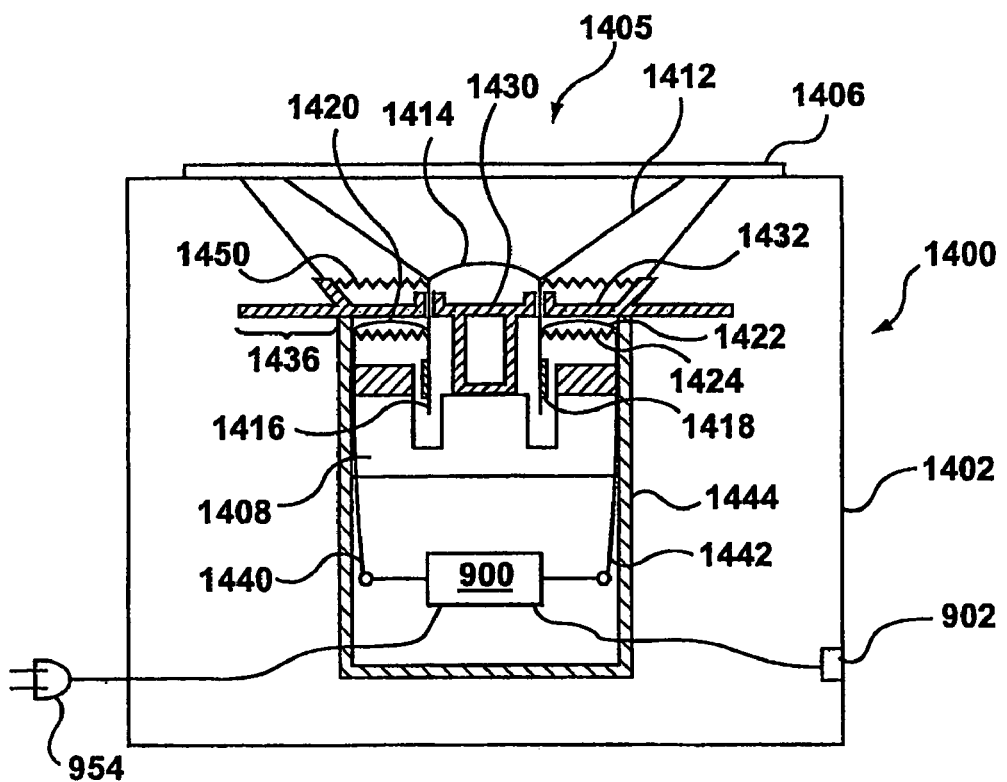
FIG. 19 is a cross-sectional drawing illustrating a second speaker assembly and a second speaker according to the present invention.

As described above, safety isolation block 903 (FIG. 9) physically isolates the input terminal 902 from the wall plug 954. This isolation is typically required by electrical safety authorities. Such authorities will also typically require that a speaker assembly must include a physical safety barrier that prevents physical access from the outside of speaker 932 to the voice coil 1316 and other electrically live elements within speaker assembly 1300. FIG. 19 illustrates one method for doing so. A barrier grill 1326 is installed on speaker housing 1302 to prevent physical access to the interior of speaker assembly 1300. Openings in barrier grill 1326 are made sufficiently small that fingers and other objects (which will typically be designated by electrically safety authorities) cannot reach the live electrical components inside speaker assembly 1300.

Reference is next made to FIG. 19, which illustrates another speaker assembly 1400 according to another aspect of the present invention. Speaker assembly 1400 is also illustrated with amplifier 900. Speaker assembly 1400 includes a speaker 1405 that is made according to the present invention. Speaker assembly 1400 does not include a barrier grill. Instead, speaker assembly 1400 includes an isolation barrier that includes a central barrier 1430 and a lateral barrier 1432. The central barrier 1430 is mounted on platform 1408 beneath the dust cap 1414. The outer edge of the central barrier 1430 is adjacent the inside of the voice coil former 1416. The lateral barrier 1432 surrounds voice coil former 1416. The space between the central barrier and the voice coil former and between the lateral barrier and the voice coil former is preferably, although not necessarily, smaller than is permitted under the standards set by electrical safety authorities. The lateral barrier 1432 is mounted to the basket 1406 at the base of the basket. Lateral barrier 1432 has a barrier flange 1436 that extends beyond the base of the basket 1406.

In speaker 1405, the voice coil former is made of a non-conductive material.

The voice coil leads 1420 and 1422 are positioned beneath lateral barrier. Voice coil leads 1420 and 1422 are coupled to amplifier by wires 1440 and 1442. In another embodiment of a speaker according to the present invention, the voice coil leads may be integrated into spider 1424, which is also below the lateral barrier 1432. Speaker 1405 includes a second optional spider 1450 that assists in supporting the moving components of the speaker.

Speaker 1405 includes an optional EMI shield 1444. Other embodiments of speakers according to the present invention may not include an EMI shield, depending on the application in which such a speaker will be used.

The central barrier 1430 and the lateral barrier 1432 inhibit a finger or other object from punching through the dust cap or the diaphragm and touching the voice coil leads, voice coil or other live electrical elements of the speaker 1405 or the speaker assembly 1400.

The barrier flange 1436 helps to inhibit a person from reaching through the basket and touching any live electrical element. The barrier flange is optional and may not be included in some speakers incorporating an isolation barrier according to the invention.

Figure 20:
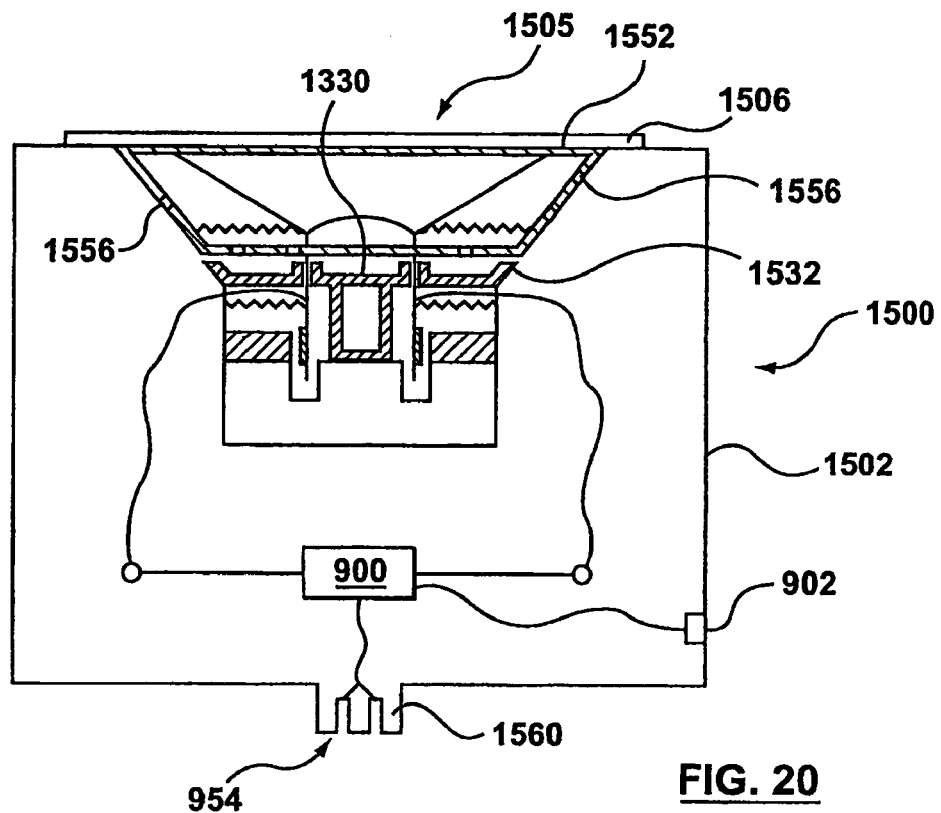
FIG. 20 is a cross-sectional drawing illustrating a third speaker assembly and a third speaker according to the present invention.

Reference is next made to FIG. 20, which illustrates another speaker assembly 1500 and another speaker 1505 according to the present invention. Speaker 1500 does not have an EMI shield. The isolation barrier of speaker 1500 includes a central barrier 1530 and a lateral barrier 1432. However, the lateral barrier does not include a barrier flange. Speaker 1505 has a basket barrier 1552. Basket barrier 1552 may be integrally formed as part of the basket 1506 or may be mounted to the basket 1506. Basket barrier 1552 contains apertures 1556 that permit air to travel through the basket barrier as diaphragm 1412 travels. However, the apertures 1556 are sufficiently small that fingers and other objects identified by safety authorities cannot reach through basket barrier to touch live electrical components inside speaker assembly 1500.

Speaker assembly 1500 also incorporates an optional safety plug 1560. An extension cord is used to provide electrical power to the safety plug 1560.

Figure 21:
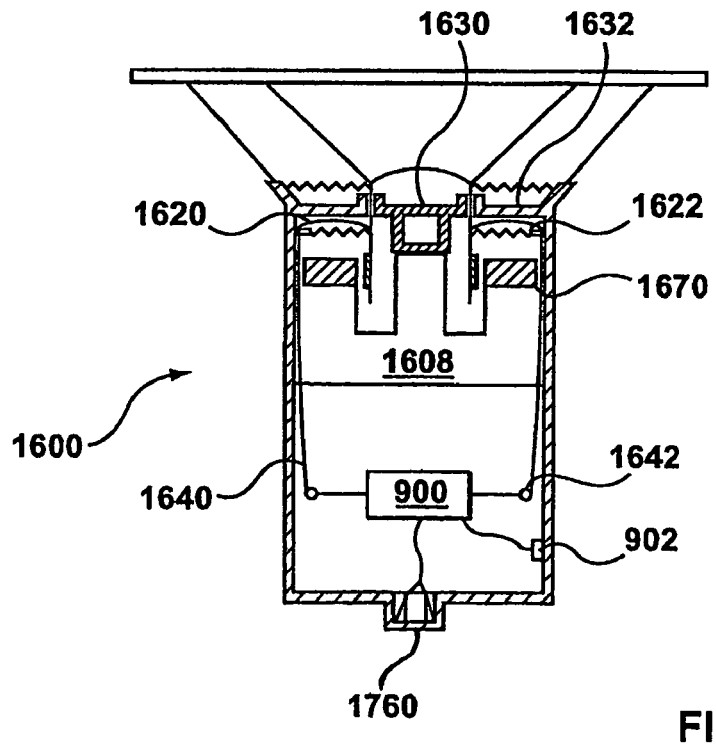
FIG. 21 is a cross-sectional drawing illustrating a fourth speaker according to the present invention.

Reference is next made to FIG. 21, which illustrates another speaker 1605 according to the present invention. Speaker 1605 includes an isolation barrier including a central barrier 1630 and a lateral barrier 1632. The isolation barrier of speaker 1605 also includes a canister barrier 1670 which extends around the base of speaker 1605. All live electrical elements of speaker 1605 are enclosed by the isolation barrier. Speaker 1605 has a safety plug 1670 at which it receives electrical power. Speaker 1605 also has an input terminal 1672 that is coupled to the input terminal 902 of the amplifier 900 integrated within the speaker.

Speakers assemblies 1400 and 1500 have been illustrated with amplifier 900. These speaker assemblies may be used with any amplifier, including amplifiers that are not described herein to utilize the isolation barrier or the basket barrier or both. Furthermore, speakers 1400 and 1500 may be used with other amplifiers and speaker assemblies to provide the benefits of the isolation barrier or the basket barrier or both. Similarly, speaker 1605 may be used with another amplifier and with any speaker assembly. In each of the speakers 1400, 1500 and 1600 the isolation barrier (or at least part of the isolation barrier) is positioned between the voice coil and other moving elements of the speaker.

Figure 22:
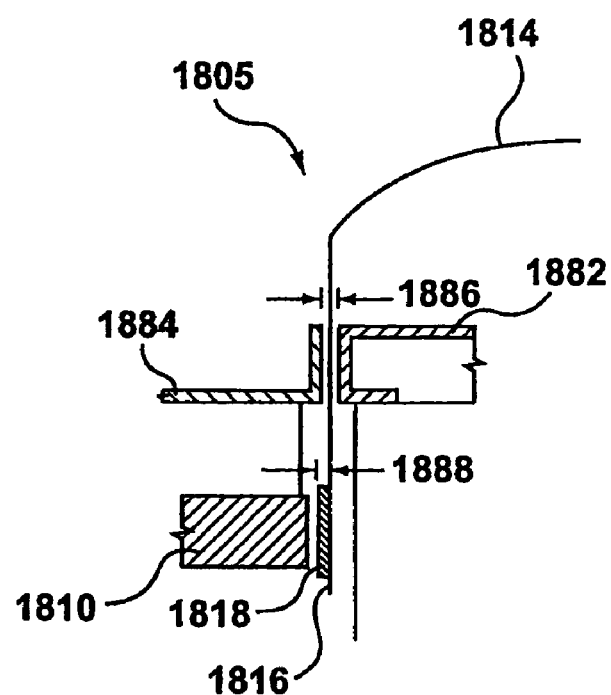
FIG. 22 is a cross-sectional drawing illustrating a fifth speaker according to the present invention.

Reference is next made to FIG. 22, which illustrates a portion of a speaker 1805 according to the present invention. A portion of the voice coil former 1816, voice coil 1818, magnet 1810 and dust cap 1814 are illustrated. An inner insulator 1880 mounted inside the voice coil former 1816 and an outer insulator 1882 mounted outside the voice coil former are also illustrated. Inner insulator 1880 and outer insulator 1882 are spaced apart from the voice coil former 1816. An insulator gap 1886 is formed between the inner and outer insulators. This gap is smaller than the thickness 1888 of the voice coil, thereby inhibiting the voice coil from being pulled through the insulator gap. Speaker 1805 reduces the chance that a person will pull the voice coil of the speaker out of the speaker thereby exposing a potentially live voice coil.

Figure 23:
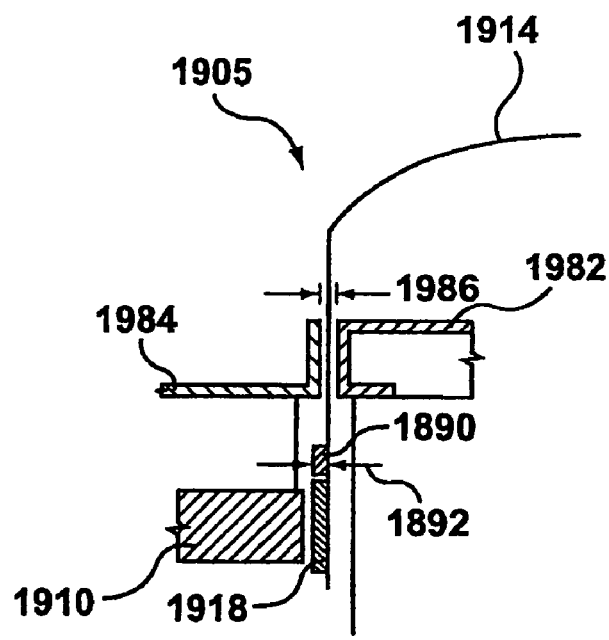
FIG. 23 is a cross-sectional drawing illustrating a sixth speaker according to the present invention.

Reference is next made to FIG. 23, which illustrates another speaker 1905 according to the present invention. Speaker 1905 is similar to speaker 1805 and also includes a blocking collar 1890 mounted on the voice coil former. The blocking collar is preferably made of a non-conducting material. The thickness of blocking collar 1892 is also greater than the insulator gap 1986. In speaker 1805, the voice coil could disintegrate and could be pulled through the insulation gap in pieces or in a strand or wire. Blocking collar 1892 helps to prevent this by providing an initial barrier that will inhibit the voice coil from reaching the insulator gap.

The small insulator gap and blocking collar of speakers 1805 and 1905 may be used with speaker 1400, 1500, 1600 and 1700 and with speakers that do not incorporate an isolation barrier.

The present invention has been described here by way of example only. Various modification and variations may be made to these exemplary embodiments without departing from the spirit and scope of the invention, which is limited only by the appended claims.

We claim:

1. An audio signal amplifier comprising:
   (a) an input terminal for receiving an input audio signal;
   (b) an output terminal;
   (c) a regulator reference generator coupled to the input terminal, wherein the regulator reference generator provides a voltage regulator reference corresponding to the input audio signal;
   (d) a voltage regulator coupled to the regulator reference generator, wherein the voltage regulator provides a power signal corresponding to the voltage regulator reference;
   (e) a compensation block coupled to the input terminal to provide a modulation control signal based on the input signal;
   (f) a modulator coupled to the compensation block wherein the modulator provides a digital modulated signal in response to the modulation control signal; and
   (g) an output stage coupled to the modulator and the voltage regulator, wherein the output stage provides an output audio signal at the output terminal by combining the digital modulated signal and the power signal.

2. The audio amplifier of claim 1 wherein the compensation block is a feed-forward compensator.

3. The audio amplifier of claim 1 wherein the compensation block is a feedback compensator and is also coupled to the voltage regulator to provide the modulation control signal based on the input signal and the power signal.

4. The audio amplifier of claim 1 wherein the compensation block is a feedback compensator and is also coupled to the output terminal to provide the modulation control signal based on the input signal and the output audio signal.

5. The audio amplifier of claim 4 further including a filter coupled between the output terminal and the compensation block.

6. The audio amplifier of claim 5 wherein the filter is a low-pass filter.

7. The audio amplifier of claim 4 wherein the compensation block includes an integrator and provides the modulation control signal by integrating the difference between the input signal and the output signal.

8. The audio amplifier of claim 1 further comprising a delay block coupled between the input terminal and the modulator to provide a delayed version of the input signal to the modulator and wherein the modulator generates the digital modulated signal based on the delayed version of the input signal.

9. The audio amplifier of claim 1 wherein the regulator reference generator includes a rectifier and wherein the voltage regulator reference is a rectified version of the input audio signal.

10. The audio amplifier of claim 1 wherein the regulator reference generator includes a rectifier and a peak detector and wherein the voltage regulator reference corresponds to the envelope of a rectified version of the input audio signal.

11. The audio amplifier of claim 1 wherein the output stage is a push-pull output stage and wherein the voltage regulator generates symmetric positive and negative power signals in response to the voltage regulator reference and wherein the positive and negative power signals are coupled across the push-pull output stage.

12. The audio amplifier of claim 11 wherein the output stage further includes a gate drive block for receiving the digital modulated signal and for alternately coupling the positive and negative power signals to the output terminal.

13. The audio amplifier of claim 3 further including a power signal scaler coupled between the voltage regulator and the feedback compensator for providing a scaled version of the power signal to the feedback compensator.

14. The audio amplifier of claim 13 wherein the feedback compensator is a divider and wherein the feedback compensator provides the modulation control signal by dividing the input signal by the scaled version of the power signal.

15. The audio amplifier of claim 13 further comprising a delay block coupled between the input terminal and the modulator to provide a delayed version of the input signal to the modulator and wherein the modulator generates the digital modulated signal based on the delayed version of the input signal and the power signal and wherein the feedback compensator is a divider and wherein the feedback compensator provides the modulation control signal by dividing the delayed version of the input signal by the scaled version of the power signal.

16. The audio amplifier claim 1 wherein a phase shift block is coupled between the input terminal and the voltage regulator.

17. The audio amplifier of claim 10 wherein a phase shift block is coupled between the input terminal and the regulator reference generator.

18. A multi-channel audio signal amplifier for amplifying two or more audio channels, wherein each channel corresponds to one input audio signal, the amplifier comprising:
(a) for each channel:
    (i) an input terminal for receiving an input audio signal for that channel;
    (ii) an output terminal;
    (iii) a compensation block coupled to the input terminal for the channel to provide a modulation control signal for the channel;
    (iv) a modulator coupled to the compensation block for the channel to provide a digital modulated signal for the channel in response to the modulation control signal; and
    (v) an output stage
(b) a regulator reference generator coupled to the input terminal for each channel, wherein the regulator reference generator provides a voltage regulator reference corresponding to the input audio signal having the largest magnitude; and
(c) a voltage regulator coupled to the regulator reference generator, wherein the voltage regulator provides a power signal corresponding the voltage regulator reference,
    wherein the output stage for each channel is coupled to the modulator for that channel and the voltage regulator and wherein the output stage for each channel provides an output audio signal for the channel at the output terminal for the channel by combining the digital modulated signal for the channel and the power signal.

19. An audio signal amplifier comprising:
(a) an input terminal for receiving an input audio signal;
(b) an output terminal;
(c) a regulator reference generator coupled to the input terminal, wherein the regulator reference generator provides a voltage regulator reference corresponding to an envelope of a rectified version of the input audio signal;
(d) a voltage regulator coupled to the regulator reference generator, wherein the voltage regulator provides a power signal corresponding the voltage regulator reference;
(e) a compensation block coupled to the input terminal to provide a modulation control signal based on the input signal;
(f) a modulator coupled to the compensation block wherein the modulator provides a digital modulated signal in response to the modulation control signal; and
(g) an output stage coupled to the modulator and the voltage regulator, wherein the output stage provides an output audio signal at the output terminal by combining the digital modulated signal and the power signal.

20. A multi-channel audio signal amplifier for amplifying two or more audio channels, wherein each channel corresponds to one input audio signal, the amplifier comprising:
(a) for each channel:
    (i) an input terminal for receiving an input audio signal for that channel;
    (ii) an output terminal;
    (iii) a compensation block coupled to the input terminal for the channel to provide a modulation control signal for the channel;
    (iv) a modulator coupled to the compensation block for the channel to provide a digital modulated signal for the channel in response to the modulation control signal; and
    (v) an output stage
(b) a regulator reference generator coupled to the input terminal for each channel, wherein the regulator reference generator provides a voltage regulator reference corresponding to the envelope of a rectified version of the input audio signal having the largest magnitude; and
(c) a voltage regulator coupled to the regulator reference generator, wherein the voltage regulator provides a power signal corresponding the voltage regulator reference,
wherein the output stage for each channel is coupled to the modulator for that channel and the voltage regulator and wherein the output stage for each channel provides an output audio signal for the channel at the output terminal for the channel by combining the digital modulated signal for the channel and the power signal.

* * * * *